United States Patent
Kaxiras et al.

(10) Patent No.: US 6,983,388 B2
(45) Date of Patent: Jan. 3, 2006

(54) METHOD AND APPARATUS FOR REDUCING LEAKAGE POWER IN A CACHE MEMORY BY USING A TIMER CONTROL SIGNAL THAT REMOVES POWER TO ASSOCIATED CACHE LINES

(75) Inventors: Stefanos Kaxiras, Jersey City, NJ (US); Philip W. Diodato, Asbury, NJ (US); Hubert Rae McLellan, Jr., Summit, NJ (US); Girija Narlikar, Jersey City, NJ (US)

(73) Assignee: Agere Systems Inc., Allentown, PA (US)

( * ) Notice: Subject to any disclaimer, the term of this patent is extended or adjusted under 35 U.S.C. 154(b) by 609 days.

(21) Appl. No.: 09/865,847

(22) Filed: May 25, 2001

(65) Prior Publication Data

US 2002/0049918 A1 Apr. 25, 2002

Related U.S. Application Data (60) Provisional application No. 60/243,173, filed on Oct. 25, 2000.

(51) Int. Cl.
G06F 1/32 (2006.01)

(52) U.S. Cl. .................. 713/324; 713/320; 711/145
(58) Field of Classification Search ............. 713/300, 713/320, 324; 365/227; 710/310; 711/125, 711/145, 154
See application file for complete search history.

(56) References Cited

U.S. PATENT DOCUMENTS

| | | | | |
|---|---|---|---|---|
| 5,430,683 A | * | 7/1995 | Hardin et al. ............... | 365/227 |
| 5,632,038 A | * | 5/1997 | Fuller ......................... | 713/324 |
| 5,737,746 A | | 4/1998 | Hardin et al. ............... | 711/118 |
| 5,813,022 A | * | 9/1998 | Ramsey et al. ............... | 711/3 |
| 5,813,028 A | * | 9/1998 | Agarwala et al. ........... | 711/118 |
| 5,835,435 A | * | 11/1998 | Bogin et al. ................ | 365/227 |
| 5,835,949 A | * | 11/1998 | Quattromani et al. ....... | 711/135 |
| 6,041,401 A | * | 3/2000 | Ramsey et al. .............. | 712/43 |
| 6,070,232 A | * | 5/2000 | Ishida et al. ................. | 711/143 |
| 6,138,213 A | * | 10/2000 | McMinn ...................... | 711/137 |
| 6,141,283 A | * | 10/2000 | Bogin et al. ................ | 365/226 |
| 6,157,977 A | * | 12/2000 | Sherlock et al. ........... | 710/310 |

(Continued)

OTHER PUBLICATIONS

"Automatic Cache Line Access Monitoring" IBM TDB, vol. 37, No. 6A, Jun. 1994, p. 299.*

K. Stein, et al., "Storage Array and Sense/Refresh Circuit for Single Transistor Memory Cells", IEEE Journal of Solid State Circuits, vol. SC-7, No. 5, 336-340 (Oct. 1972).*

(Continued)

*Primary Examiner*—Chun Cao (57) ABSTRACT

A method and apparatus are disclosed for reducing leakage power in a cache memory. A cache decay technique is employed for both data and instruction caches that removes power from cache lines that have not been accessed for a predefined time interval, referred to as the decay interval. The cache-line granularity of the present invention permits a significant reduction in leakage power while at the same time preserving much of the performance of the cache. The decay interval is maintained using a timer that is reset each time the corresponding cache line is accessed. The decay interval may be fixed or variable. Once the decay interval timer exceeds a specified decay interval, power to the cache line is removed. Once power to the cache line is removed, the contents of the data and tag fields are allowed to decay and the valid bit associated with the cache line is reset. When a cache line is later accessed after being powered down by the present invention, a cache miss is incurred while the cache line is again powered up and the data is obtained from the next level of the memory hierarchy.

35 Claims, 5 Drawing Sheets

U.S. PATENT DOCUMENTS

| | | | |
|---|---|---|---|
| 6,345,336 B1 * | 2/2002 | Takahashi | 711/125 |
| 6,385,697 B1 * | 5/2002 | Miyazaki | 711/128 |
| 6,408,364 B1 * | 6/2002 | Tan et al. | 711/136 |
| 6,473,814 B1 * | 10/2002 | Lyons et al. | 710/35 |
| 6,490,654 B2 * | 12/2002 | Wickeraad et al. | 711/133 |
| 6,510,494 B1 * | 1/2003 | Arimilli et al. | 711/137 |
| 6,535,961 B2 * | 3/2003 | Wilkerson et al. | 711/137 |
| 6,795,896 B1 * | 9/2004 | Hart et al. | 711/118 |

OTHER PUBLICATIONS

K. Stein, et al., Session V: Memory II, "Storage Array and Sense/Refresh Circuit for Single Transistor Memory Cells", IEEE International of Solid State Circuits conference, 1972, pp. 56-57.*

Burger et al., "The Declining Effectiveness of Dynamic Caching for General-Purpose Microprocessors," University of Wisconsin-Madison, CS TR #1261, (1995).

Powell et al., "Gated-V $_{dd}$: A Circuit Technique to Reduce Leakage in Deep-Submicron Cache Memories," Purdue University,ISLPED '00, Rapallo, Italy, (2000).

Wood et al., "A Model for Estimating Trace-Sample Miss Ratios," Proc. of ACM Sigmetrics Conf. on Measurement and Modeling of Computer Systems, (May 1991).

Yang et al., "An Integrated Circuit/Architecture Approach to Reducing Leakage in Deep-Submicron High-Performance I-Caches," Proc. of the Seventh Int'l Symposium on High-Performance Computer Architecture (HPCA), (2001).

* cited by examiner

| CACHE LINE NUMBER | TAG | DATA | VALID BIT | DIRTY BIT |
|---|---|---|---|---|
| 0 | | | | |
| 1 | | | | |
| 2 | | | | |
| ⋮ | ⋮ | ⋮ | ⋮ | ⋮ |
| C−1 | | | | |

K WORDS

METHOD AND APPARATUS FOR REDUCING LEAKAGE POWER IN A CACHE MEMORY BY USING A TIMER CONTROL SIGNAL THAT REMOVES POWER TO ASSOCIATED CACHE LINES

CROSS-REFERENCE TO RELATED APPLICATION

This application claims the benefit of U.S. Provisional Application No. 60/243,173, filed Oct. 25, 2000.

FIELD OF THE INVENTION

The present invention relates generally to cache memory devices, and more particularly, to methods and apparatus for reducing the leakage power in such cache memories.

BACKGROUND OF THE INVENTION

Figure 1:
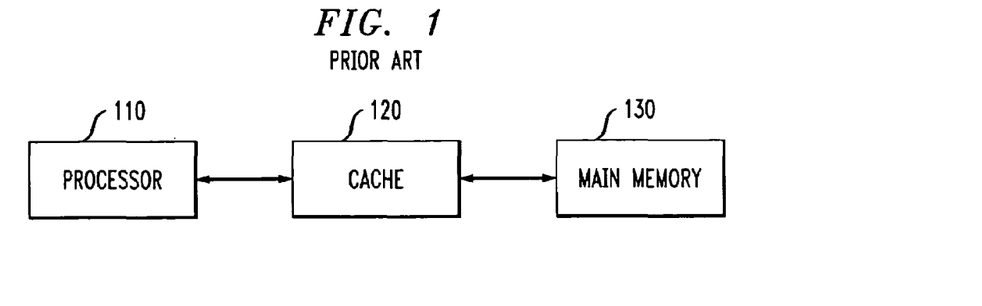
FIG. 1 illustrates a conventional cache architecture.

Cache memories reduce memory access times of large external memories. FIG. 1 illustrates a conventional cache architecture where a cache memory 120 is inserted between one or more processors 110 and a main memory 130. Generally, the main memory 130 is relatively large and slow compared to the cache memory 120. The cache memory 120 contains a copy of portions of the main memory 130. When the processor 110 attempts to read an area of memory, a check is performed to determine if the memory contents are already in the cache memory 120. If the memory contents are in the cache memory 120 (a cache "hit"), the contents are delivered directly to the processor 110. If, however, the memory contents are not in the cache memory 120 (a cache "miss"), a block of main memory 130, consisting of some fixed number of words, is typically read into the cache memory 120 and thereafter delivered to the processor 110.

Cache memories 120 are often implemented using CMOS technology. To achieve lower power and higher performance in CMOS devices, however, there is an increasing trend to reduce the drive supply voltage ($V_{dd}$) of the CMOS devices. To maintain performance, a reduction in the drive supply voltage necessitates a reduction in the threshold voltage ($V_{th}$), which in turn increases leakage power dissipation exponentially. Since chip transistor counts continue to increase, and every transistor that has power applied will leak irrespective of its switching activity, leakage power is expected to become a significant factor in the total power dissipation of a chip. It has been estimated that the leakage power dissipated by a chip could equal the dynamic power of the chip within three processor generations.

One solution for reducing leakage power is to power down unused devices. M. D. Powell et al., "Gated-$V_{dd}$: A Circuit Technique to Reduce Leakage in Deep-Submicron Cache Memories," ACM/IEEE International Symposium on Low Power Electronics and Design (ISLPED) (2000) and Se-Hyun Yang et al., "An Integrated Circuit/Architecture Approach to Reducing Leakage in Deep-Submicron High-Performance I-Caches," ACM/IEEE International Symposium on High-Performance Computer Architecture (HPCA) (January 2001) propose a micro-architectural technique referred to as a dynamically resizable instruction (DRI) cache and a gated-$V_{dd}$ circuit-level technique, respectively, to reduce power leakage in static random access memory (SRAM) cells by turning off power to large blocks of the instruction cache.

While the techniques disclosed in M. D. Powell et al. and Se-Hyun Yang et al. reduce leakage power for instruction caches, a need exists for a method and apparatus for reducing leakage power in both instruction and data cache memories. A further need exists for a method and apparatus for reducing leakage power in cache memories that can remove the power of individual cache lines. Yet another need exists for a cache memory with reduced power consumption.

SUMMARY OF THE INVENTION

Generally, a method and apparatus are disclosed for reducing leakage power in a cache memory. The present invention removes power from cache lines that have been inactive for some period of time assuming that these cache lines are unlikely to be accessed in the future. A cache decay technique is employed that removes power from cache lines that have not been accessed for a predefined time interval, referred to as the decay interval. The cache decay techniques disclosed herein reduce leakage power dissipation in cache memories and thus yield cache memories with reduced power consumption. The cache-line granularity of the present invention permits a significant reduction in leakage power while at the same time preserving much of the performance of the cache. The cache decay techniques of the present invention can be successfully applied to both data and instruction caches, to set-associative caches and to multilevel cache hierarchies.

The decay interval is maintained using a timer that is reset each time the corresponding cache line is accessed. The decay interval may be variable to permit dynamic adjustments to the decay interval to allow the decay interval to be increased or decreased as desired to increase performance or save power, respectively. If the decay interval timer exceeds the specified decay interval, power to the cache line is removed. Once power to the cache line is removed, the contents of the data field, and the tag field are allowed to degrade (possibly lose their logical values) while the valid bit associated with the cache line is reset. When a cache line is later accessed after being powered down by the present invention, a cache miss is incurred (because the valid bit has been reset) while the cache line is again powered up and the data is obtained from the next level of the memory hierarchy.

A more complete understanding of the present invention, as well as further features and advantages of the present invention, will be obtained by reference to the following detailed description and drawings.

DETAILED DESCRIPTION

Figure 2:
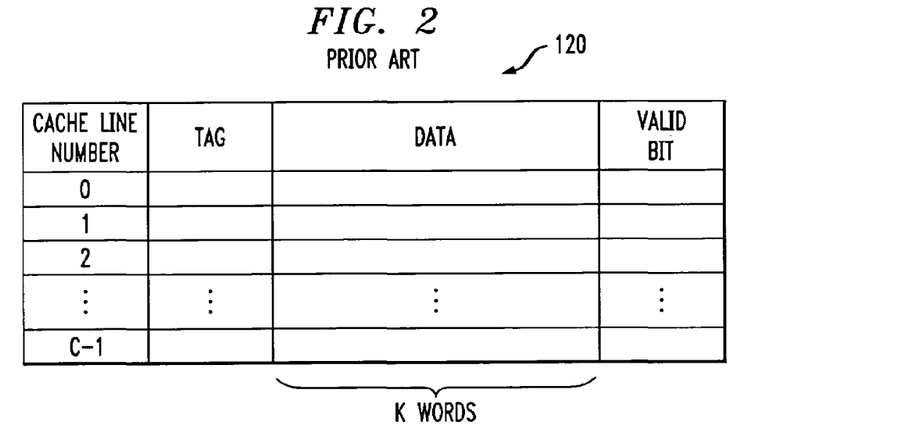
FIG. 2 illustrates the structure of the conventional cache memory of FIG. 1 in further detail.

FIG. 2 illustrates the structure of the conventional cache memory 120 of FIG. 1 in further detail. As shown in FIG. 2, the cache memory 120 consists of C cache lines of K words each. The number of lines in the cache memory 120 is generally considerably less than the number of blocks in main memory 130. At any time, a portion of the blocks of main memory 130 resides in lines of the cache memory 120. An individual line in the cache memory 120 cannot be uniquely dedicated to a particular block of the main memory 130. Thus, as shown in FIG. 2, each cache line includes a tag indicating which particular block of main memory 130 is currently stored in the cache 120. In addition, each cache line includes a valid bit indicating whether the stored data is valid.

The present invention provides a cache decay technique that removes power from cache lines that have not been accessed for a predefined time interval, referred to as the decay interval. The decay interval may be variable to permit dynamic adjustments to the decay interval to allow the decay interval to be increased or decreased as desired to increase performance or save power, respectively.

The cache decay techniques described herein reduce leakage power dissipation in caches. The power to a cache line that has not been accessed within a decay interval is turned off. When a cache line is thereafter accessed that has been powered down by the present invention, a cache miss is incurred while the line is powered up and the data is fetched from the next level of the memory hierarchy. It is noted that the present invention may be employed in any level of the memory hierarchy, as would be apparent to a person of ordinary skill in the art. By controlling power using such cache-line granularity, the present invention achieves a significant reduction in leakage power while at the same time preserving much of the performance of the cache. A decay cache can have an effective powered size much smaller than a cache of equal miss-rate. Alternatively, a decay cache with the effective powered size of a small cache performs better.

In addition, the full performance of the decay cache is available to demanding applications when power consumption is not an issue. This flexibility of the decay cache is particularly useful in battery-powered computers. The cache decay techniques of the present invention can be successfully applied to both data and instruction caches. With the increasing importance of leakage power in upcoming generations of CPUs, and the increasing size of on-chip memory, cache decay can be a useful architectural tool to reduce leakage power consumption.

As previously indicated, M. D. Powell et al. disclose a technique for powering down sections of the instruction cache and resizing the cache that significantly reduces leakage power. The present invention removes power from parts of the data cache with a finer granularity (cache-line granularity) and without resizing. The present invention relies on the fact that many cache frames are under-utilized and therefore can be turned off without impacting performance. Generally, the present invention attempts to power down the cache lines that were not accessed for the specified decay interval assuming that these will be unlikely to be accessed in the future.

Since most consecutive accesses to the same cache-line are spaced closely in time (temporal locality), a cache line that has not been accessed for some time either will not be accessed again or it is one of the few cache lines that will be accessed very far into the future. Therefore, the present invention maintains power to cache lines as long as they are accessed within the decay interval. As discussed further below, the passage of the decay interval from the last access to each cache line may be detected using a digital or analog implementation.

The present invention recognizes that cache-line decay will increase the miss rate of the cache. In other words, a few lines will be powered-off in accordance with the present invention before they are accessed. However, it can be shown that the miss rate of a decay cache is still less than a smaller cache whose size matches the average powered size of the decay cache. Another way to view the decay cache is from a leakage power efficiency perspective, where the average powered size of a decay cache is smaller than a cache of equal miss rate.

Digital Implementation

The recency of a cache line access can be represented via a digital counter that is cleared on each access to the cache line and incremented periodically at fixed time intervals. Once the counter reaches a specified count, the counter saturates and removes the power (or ground) to the corresponding cache line.

It has been observed that decay intervals tend to be on the order of tens or hundreds of thousands of cycles. The number of cycles needed for a reasonable decay interval thus makes it impractical for the counters to count cycles (too many counter bits would be required). Thus, the number of required bits can be reduced by "ticking" the counters at a much coarser level, for example, every few thousand cycles. A global cycle counter can be utilized to provide the ticks for smaller cache-line counters. Simulations have shown that a two-bit counter per cache line provides sufficient resolution with four quantized counter levels. For example, if a cache line should be powered down 10,000 clock cycles following the most recent access, each of the four quantized counter levels corresponds to 2,500 cycles.

Figure 3:
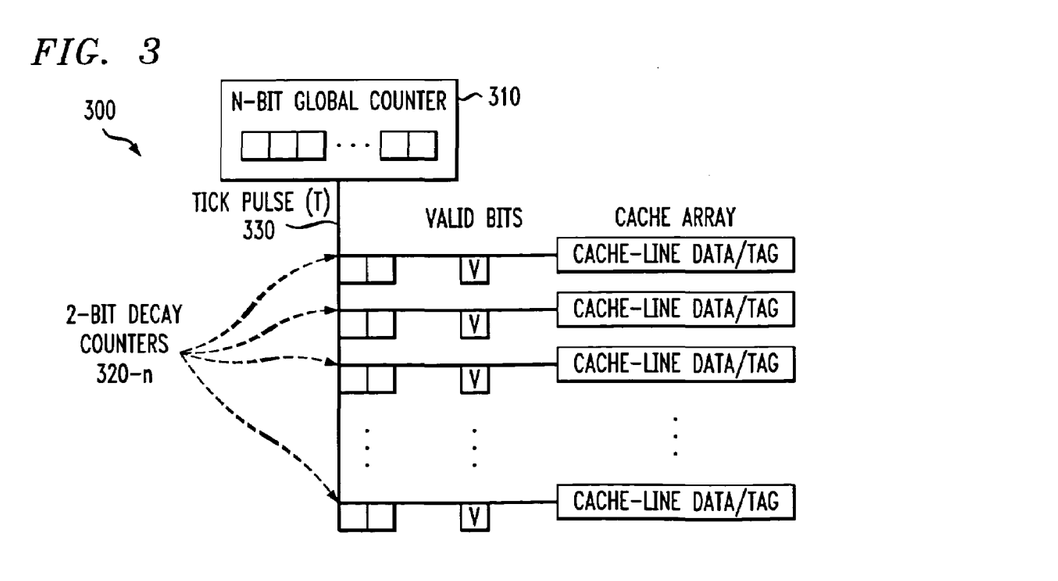
FIG. 3 illustrates a digital implementation of a cache memory in accordance with the present invention.

FIG. 3 illustrates a digital implementation of a cache memory 300 in accordance with the present invention. As shown in FIG. 3, the cache memory 300 includes a two-bit saturating counter 320-$n$ (hereinafter, collectively referred to as counters 320) associated with each cache line, and an N-bit global counter 310. In addition, each cache line includes a tag indicating which particular block of main memory 130 is currently stored in the cache line and a valid bit indicating whether the stored data is valid. To save power, the global counter 310 can be implemented, e.g., as a binary ripple counter. An additional latch (not shown) holds a maximum count value that is compared to the global counter 310. When the global counter 310 reaches the maximum value, the global counter 310 is reset and a one-clock-cycle T signal is generated on a global time signal distribution line 330. The maximum count latch (not shown) is non-switching and does not contribute to dynamic power dissipation. In general and on average using small cache line counters, very few bits are expected to switch per cycle.

Figure 4:
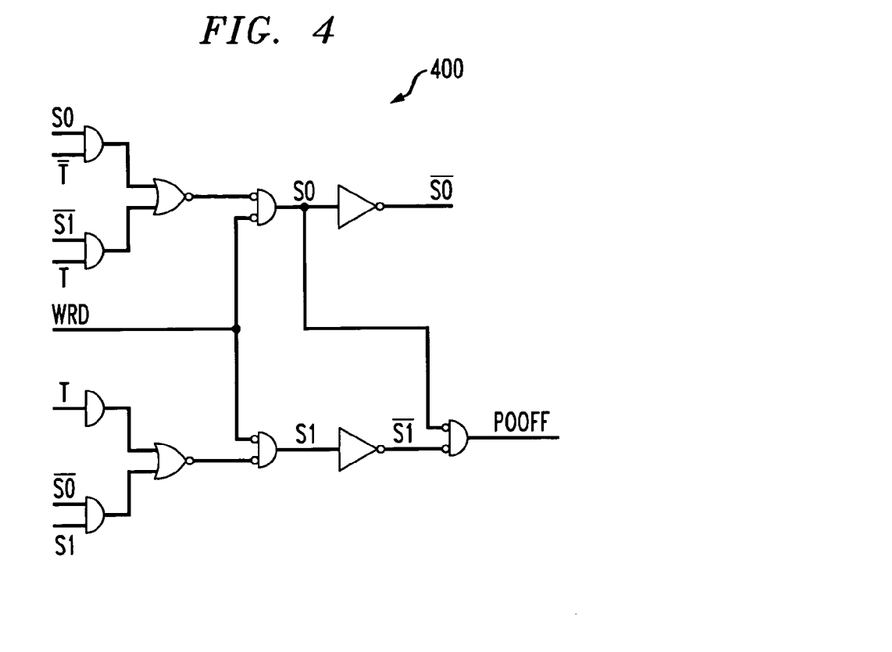
FIG. 4 illustrates exemplary circuitry for each cache line in the exemplary digital implementation of FIG. 3.

To minimize state transitions in the counters 320 and thus minimize dynamic power consumption, the exemplary digital implementation of the present invention uses Gray coding so that only one bit changes state at any time. Furthermore, to simplify the counters 320 and minimize the transistor count, the counters 320 are implemented asynchronously. In a further variation, the counters 310, 320 can be implemented as shift registers. FIG. 4 illustrates the circuitry 400 required for each cache line in the exemplary digital implementation. Each cache line contains circuitry to implement the state machine depicted in FIG. 5.

Figure 5:
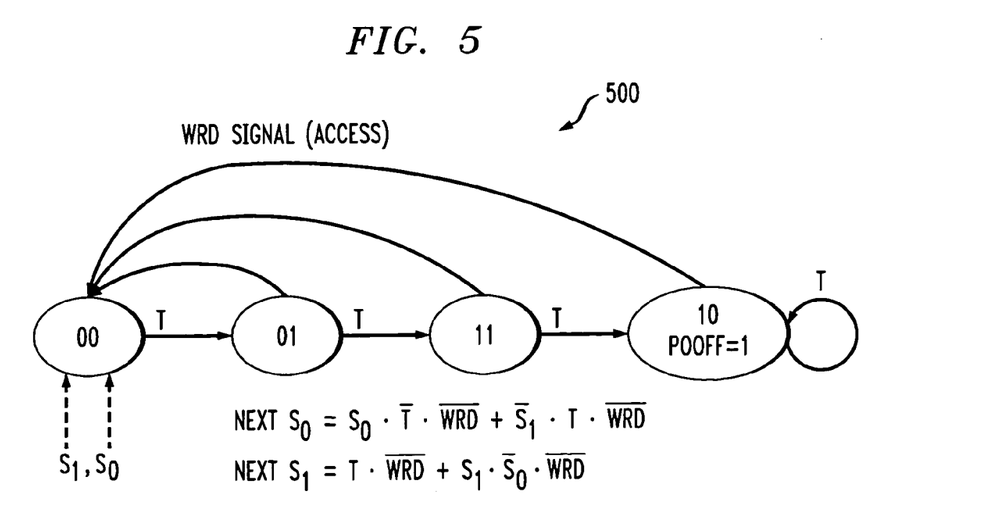
FIG. 5 provides a state diagram for the exemplary two-bit counter of FIGS. 3 and 4.

FIG. 5 provides the state diagram 500 for exemplary two-bit (S0, S1), saturating, Gray-code counters 320 with two inputs (WRD and T). T is the global time signal generated by the (synchronous) global counter 310 to indicate the passage of time. T is a well-behaved digital signal whose period may be adjusted externally to provide different decay intervals appropriate for different programs. The second state machine input is the cache line access signal, WRD, which is decoded from the address and is the same signal used to select a particular row within the cache memory 300 (e.g., the WORD-LINE signal). As shown in FIG. 5, state transitions occur asynchronously on changes of the two input signals, T and WRD. Since T and WRD are well-behaved signals, there are no meta-stability problems. The only output is the cache-line switch state, PowerOFF (POOFF). The cache line is reset and returns to state 00 each time the cache line is accessed.

When power to a cache line is turned off (state 10), the cache decay should disconnect the data and corresponding tag fields associated with the cache line from power supply. Removing power from a cache line has important implications for the rest of the cache circuitry. In particular, the first access to a powered-off cache line should:

1. result in a cache miss (since data and tag might be corrupted without power);

2. reset the corresponding counter 320-$i$ and restore power to the cache line (i.e., restart the decay mechanism as per FIG. 4); and 3. be delayed for a period of time until the cache-line circuits stabilize after power is restored (the inherent access time to main memory should be a sufficient delay in many situations).

Figure 6:
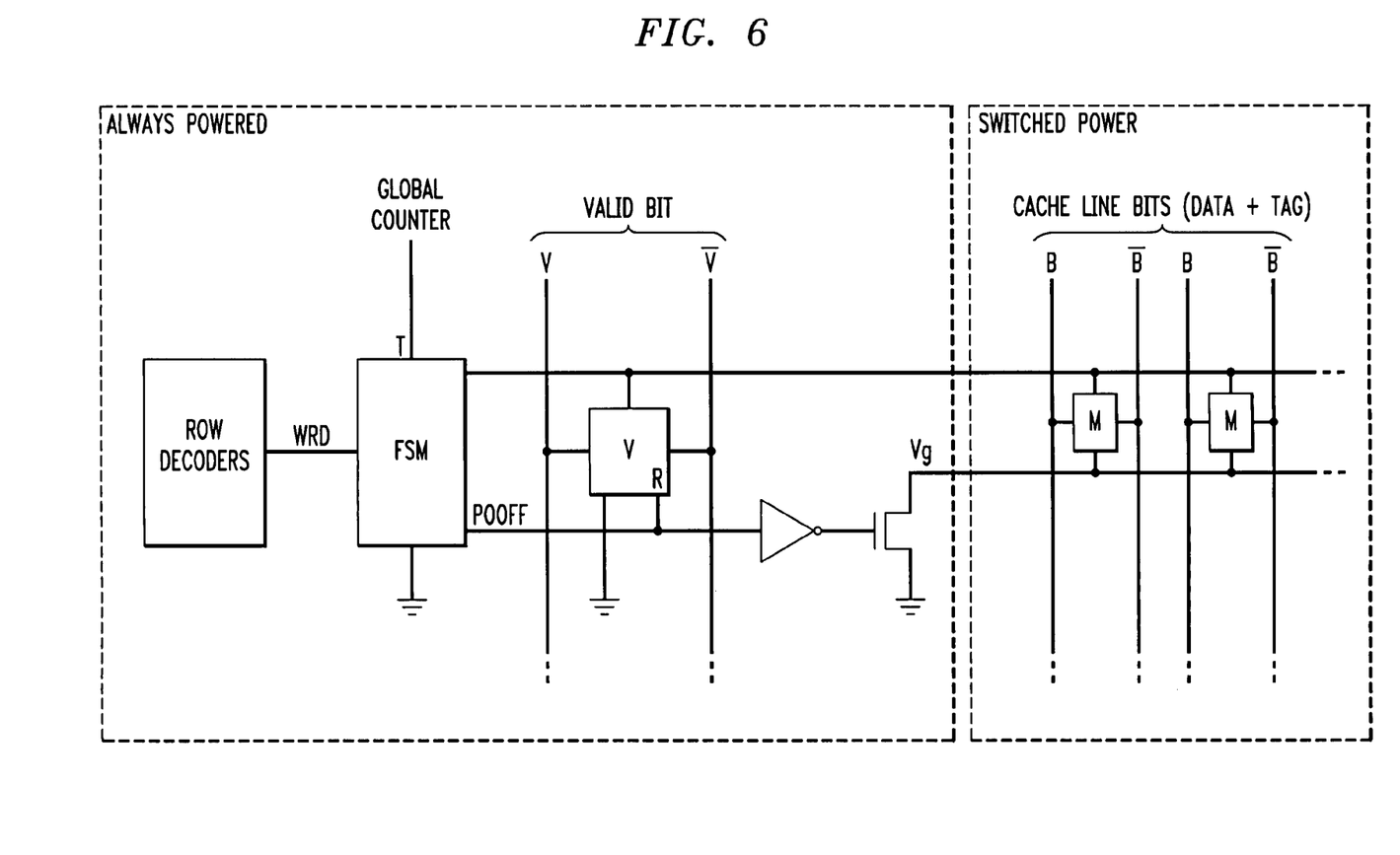
FIG. 6 is a block diagram illustrating cache-line power control aspects of the present invention.

To satisfy these requirements, the present invention employs the Valid bit of the cache line as part of the decay mechanism, as shown in FIG. 6. FIG. 6 illustrates the cache-line power control in accordance with the present invention. First, the circuitry shown in FIG. 6 ensures that the valid bit is always powered (as is the counter). Second, the circuitry shown in FIG. 6 provides a reset capability to the valid bit so it can be reset to 0 (invalid) by the decay mechanism. The PowerOFF signal clears the valid bit. Thus, the first access to a powered-off cache line always results in a miss regardless of the contents of the tag. Since satisfying this miss from the lower memory hierarchy is the only way to restore the valid bit, a newly powered cache line will have enough time to stabilize. In addition, no other access (to this cache line) can read the possibly corrupted data in the interim.

The digital implementation can be controlled at run-time by the operating system (OS) or by any other hardware run-time monitoring system via the global cycle counter 310. The OS or other system can set the period ($T_{period}$) of the global counter 310 to produce the desired decay interval according to the demands of the executing application and the power-consumption requirements of the computer system. Profiling and/or run-time monitoring can be used to adjust decay intervals. Adaptive approaches may also be employed, where the decay interval is adjusted individually for each cache line. By monitoring the extraneous decay misses of each cache line, the decay interval can be adjusted to avoid repeating mistakes. Thus, good performance is possible without the need to set a decay interval on a per-application basis.

Analog Implementation

Figure 7:
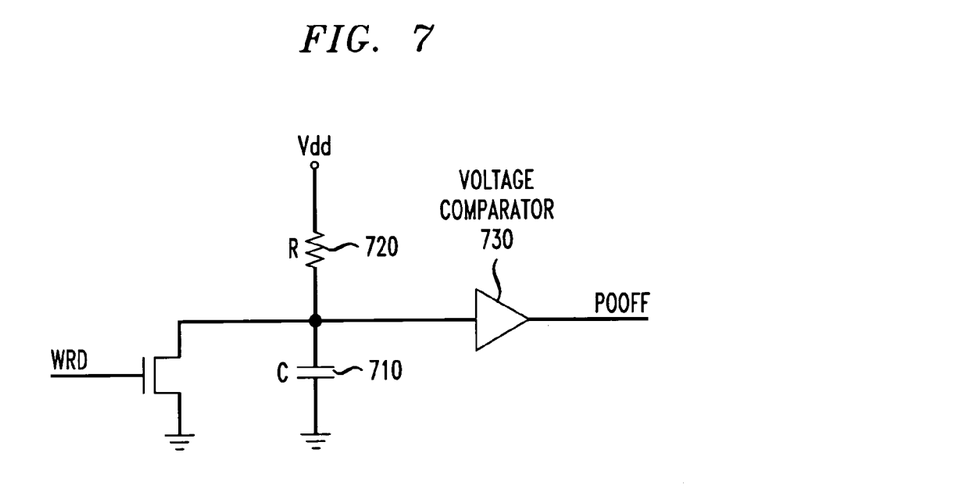
FIG. 7 illustrates an analog implementation of a decay counter for a cache memory in accordance with the present invention.

The recency of a cache line access can alternatively be implemented using an event, such as the charging or discharging of a capacitor 710, as shown in FIG. 7. Thus, each time a cache line is accessed, the capacitor is grounded. In the common case of a frequently accessed cache-line, the capacitor will be discharged. Over time, the capacitor is charged through a resistor 720 connected to $V_{dd}$. Once the charge reaches a sufficiently high level, a voltage comparator 730 detects the charge, asserts the PowerOFF signal and disconnects the power supply from the corresponding cache line (data bits and tag bits).

Although the RC time constant cannot be changed (it is determined by the fabricated size of the capacitor and resistor), the bias of the voltage comparator 630 can be adjusted to accommodate the temporal access patterns of different programs. An analog implementation is inherently noise sensitive and process technology sensitive and can change state asynchronously with the remainder of the digital circuitry. A method of synchronously sampling the voltage comparator can be employed to avoid meta-stability.

It is noted that an analog implementation of the present invention is particularly well-suited for dynamic random access memory (DRAM) technologies where data is stored as a charge on a capacitor, as discussed hereinafter. In a DRAM implementation, the stored data charge will decay naturally and must be refreshed. The validity of the data is ensured by a valid bit that decays faster than the corresponding stored data charge. Thus, the decay of the valid bit can correspond to the decay counter in accordance with the present invention.

Static and Dynamic Random Access Memory Hybrid

The cache decay techniques of the present invention can be applied to hybrid memory technologies incorporating both static and dynamic memory architectures, as would be apparent to a person of ordinary skill in the art based on the disclosure herein. The application of the present invention to a hybrid memory is illustrated using a decay cache that employs 4-transistor memory cells without a path to ground.

When conventional SRAM circuits are used for the design of caches, in deep-submicron technologies, static power dissipation is an obvious concern. Attempts to reduce this power dissipation in applications with SRAM based cache memory, such as those described in M. D. Powell et al., "Gated-$V_{dd}$: A Circuit Technique to Reduce Leakage in Deep-Submicron Cache Memories," ACM/IEEE International Symposium on Low Power Electronics and Design (ISLPED) (2000), employ circuit design techniques that gate (or cutoff) the current path (from supply voltage) to ground of individual cache lines. These techniques are effective in cutting off some of the current flow to ground, however, they have an area-performance tradeoff resulting from the additional peripheral circuitry required to gate the current path to each cache line.

One approach that is not seen in the literature, but appears to have a clear power advantage in cache design, is the use of a multi-transistor DRAM cell, such as those described in K. Stein, etal., "Storage Array and Sense/Refresh Circuit for Single Transistor Memory Cells", IEEE Journal of Solid State Circuits, Vol. SC-7, No. 5, 336-340 (October 1972). This class of DRAM cell, in particular DRAM cells that employ four transistors per cell (4T-DRAM) have no path (from supply voltage) to ground and therefore require no additional circuitry to gate the current path to ground. The cell size of a 4T-DRAM is smaller than a SRAM cell because they only require four transistors. 4T-DRAM cells without a path to ground also have an electronic charge decay that somewhat mimics the data decay of DRAM memory cells, discussed above. 4T-DRAM cells naturally decay over time without the need to "switch" them off, as with SRAM memory cells that are connected to supply voltage and ground. In that respect, they behave as DRAM cells.

Thus, according to another aspect of the present invention, cache decay mechanisms are disclosed for 4T-DRAM caches similar to the SRAM decay mechanisms described herein. The decay mechanism is used to indicate when the values of the memory cells become unreliable because of their intrinsic decay (rather than to "switch-off" the memory cells of the cache line since this is unnecessary in this design).

The 4T-DRAM cells of a cache line are charged to hold logical values (0 and 1) when the cache line is written. These memory cells decay over time losing their charge. Each time the cells are accessed, they are re-charged automatically to the correct logical values. However, if a long period of time elapses without any access, the memory cells will decay to the point where they become unreliable and it is not possible to recover the correct logical values without significant errors. A safe period can be established in which accessed cells are still reliable. The exact value of this period (on the order of milliseconds) depends on characteristics of the integrated circuit (IC) process used to manufacture the memory cells.

The purpose of a decay mechanism in this case is to signal the end of the safe period after the last access. The maximum decay interval in this case is equal to the safe period. Similar to SRAM caches, the Valid bit can be used to indicate that the cache line is considered invalid. The Valid bit should not decay with the rest of the memory cells and should always be reliable. The Valid bit can be manufactured as a standard 6-transistor SRAM cell, or be refreshed periodically to ensure its reliability. A decay counter per cache line (implemented as a finite state machine as described in the SRAM cache decay above) counts time since the last access to the cache line. At the end of the safe period, the decay counter resets the Valid bit to indicate that the data is invalid.

Because the memory cells in a 4T-DRAM discharge with a specific rate (as do the DRAM memory cells) there is no benefit in "decaying" and invalidating a cache line any sooner than the end of the safe period. Because the safe period is large (on the order of milliseconds which translates to hundreds of thousands of machine cycles for processor clocks in the hundreds of MHz), the local cache-line decay counters can be very coarse-grained (i.e., with very low resolution). In this case, single-bit local cache-line decay counters can be used. The global counter ticks at a period half of the safe period. The single-bit local counter implements the finite state machine shown in FIG. 10. Since the last access to a cache line in relation to the next global tick pulse is unknown, decay intervals range from half safe period to a full safe period. On average, the decay interval of the 1-bit decay counter is ¾ of the safe period.

Figure 9:
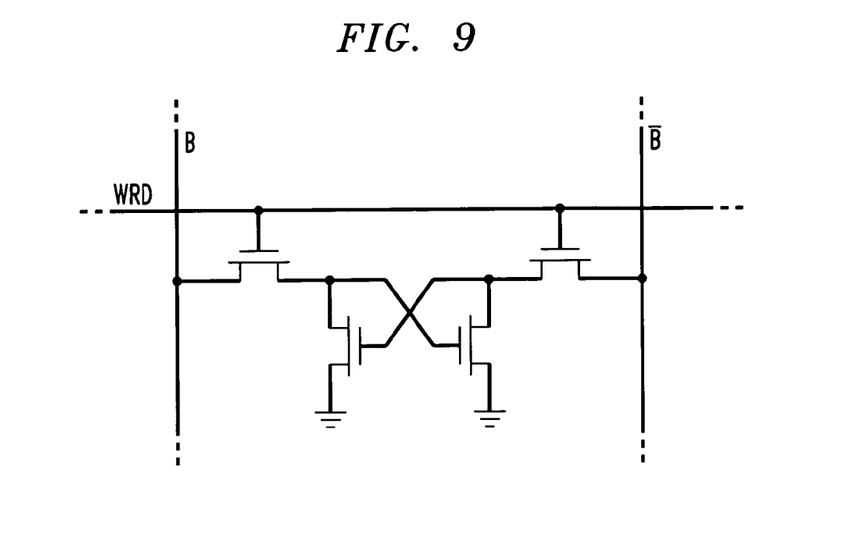
FIG. 9 illustrates a 4-transistor hybrid SRAM/DRAM memory cell without a path to ground.
Figure 10:
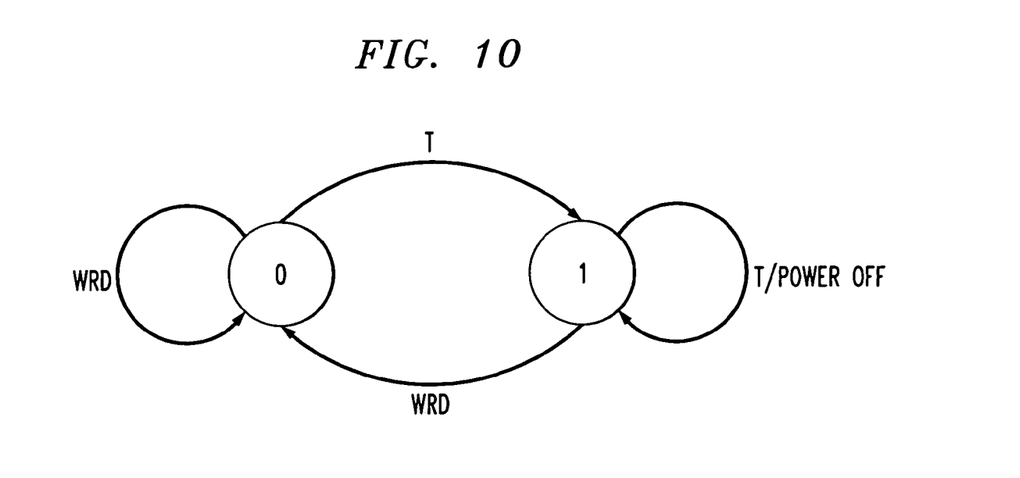
FIG. 10 illustrates a state diagram for a one-bit counter used to decay 4T-DRAM cache lines.

FIG. 9 illustrates an exemplary 4T-DRAM memory cell (bit) containing four transistors. WRD is the word line used when accessing the cell. B and B-BAR are the bit lines that read or write the value of the cell. The 4T-DRAM memory cell directly replaces ordinary 6transistor SRAM memory cells. FIG. 10 illustrates a state diagram for a one-bit local cache-line counter used to decay the 4T-DRAM cache lines of FIG. 9.

Write-Back Cache Implementation

Figure 8:
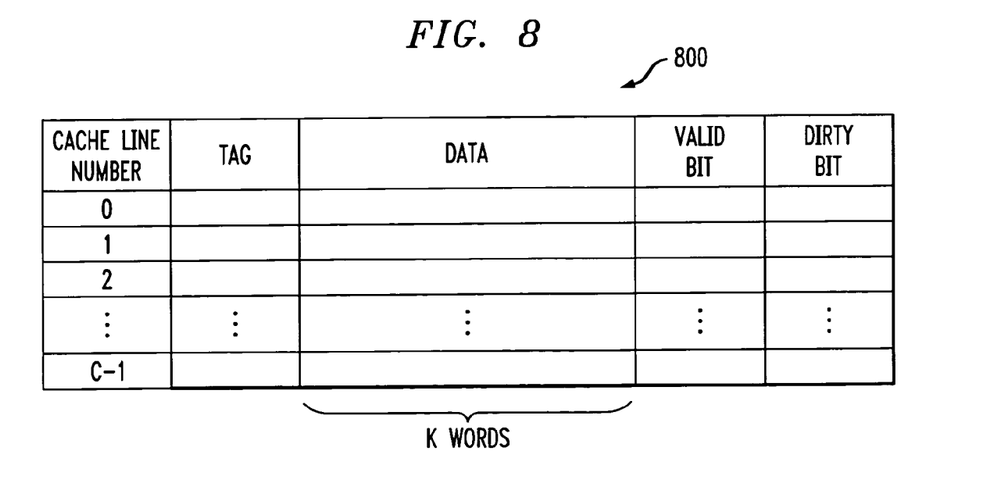
FIG. 8 illustrates the structure of an alternative cache memory in accordance with the present invention.

A processor that employs a write-back cache architecture can update the cache with a new value without updating the corresponding location(s) of main memory. Thus, if the decay interval for a cache line has been reached, the cache line cannot be powered-down in accordance with the present invention until the modified data has been written to the appropriate location of main memory. Thus, as shown in FIG. 8, in addition to having fields for the Valid bit, tag and data, each cache line of a cache 800 optionally maintains a "dirty bit" identifier indicating if the value stored in a given cache line needs to be written back to the appropriate location of main memory, as identified by the tag. The dirty bit is set by the processor each time the cache is updated with a new value without updating the corresponding location(s) of main memory.

In a further variation, the global time signal, T, supplied by the global cycle counter 310 can be cascaded from one cache line counter to another (or from one group of counters to another), to distribute the "writing back" of "dirty" cache lines in a write-back cache implementation. Thus, a given cache line (or group of cache lines) writes back to main memory, if necessary, before passing the global time signal, T, to the next cache line (or group of cache lines). In this manner, the cascading of the distribution of the global time signal, T, spreads out the decay associated with a single count from the global counter 310.

The additional dynamic power dissipated due to the decay circuitry of the present invention is proportional to the product of its load capacitance and the transistor switching activity. For the digital implementation described herein, less than 110 transistors switch on average every cycle. The entire decay circuitry involves a very small number of transistors: a few hundred for the global counter plus under 30 transistors per local cache line counter. All local counters change value with every T pulse. However, this happens at very coarse intervals (equal to the period of the global counter). Resetting a local counter with an access to a cache line is not a cause of concern either. If the cache line is heavily accessed, the counter has no opportunity to change from its initial value so resetting it does not expend any dynamic power (none of the counter's transistors switch). The cases where power is consumed are accesses to cache lines that have been idle for at least one period of the global counter. It has been observed that over all the 2-bit counters used by the present invention, there is less than one bit transition per cycle on average. Thus, the dynamic power dissipation of the decay circuitry is negligible compared to the dynamic power dissipated in the remainder of the chip, which presumably contains millions of transistors.

Cache Decay in Multilevel Cache Hierarchies

Many systems employ multilevel cache hierarchies consisting of a relatively small and fast level-one (L1) cache and one or more levels of increasingly larger and slower caches, level-two (L2), level-three (L3), . . . level-N (LN). Typically, larger caches that are lower in the hierarchy would see far fewer accesses that are farther apart (since the processor's stream of accesses is filtered by hits in upper levels). Decay intervals for each level should be sized accordingly (i.e., larger decay intervals for larger low-level caches). Decay intervals can be sized by the appropriate selection of the tick signal (T) period.

Multilevel inclusion in a cache hierarchy ensures that the contents of a higher level cache (e.g., L1) are a subset of the contents of its immediate lower level cache (e.g., L2). Multilevel inclusion is enforced in many designs. In cache hierarchies that do not enforce multilevel inclusion, cache lines can be independently decayed in the different level caches. For example, data in L2 can be decayed independently of their existence in L1. In cache hierarchies where multilevel inclusion is enforced, decay mechanisms must be modified to preserve inclusion.

Typically, in a cache hierarchy where multilevel inclusion is enforced, an inclusion bit in every cache line (in all levels except L1), indicates whether the cache-line data exist in upper levels. In the case of different size cache lines among hierarchy levels, multiple inclusion bits may be used to indicate the exact parts of a cache line that exist in upper levels. If, for example, the L1 line size is 32 bytes and the L2 line size is 128 bytes, 4 inclusion bits in the L2 cache lines are used to accurately reflect data inclusion. The decay mechanism of the present invention is modified so that when the inclusion bit indicates the existence of the same data in upper levels, only the data field is allowed to decay but not the tag field. The tag field remains powered-on, thus preserving a placeholder for the data that exist in the upper levels. Multilevel inclusion is preserved for the tags only. Decay of a cache line that does not exist in higher levels, proceeds normally. Access to a cache line with only the tag powered-on results in a miss. Another solution that preserves multilevel inclusion would be to allow the decay of a cache line only if it was also decayed in upper levels. Decay of a cache line that does not exist in higher levels, proceeds normally.

It is to be understood that the embodiments and variations shown and described herein are merely illustrative of the principles of this invention and that various modifications may be implemented by those skilled in the art without departing from the scope and spirit of the invention.

We claim:

1. A cache memory, comprising:
   a plurality of cache lines for storing a value from main memory; and
   a timer associated with each of said plurality of cache lines, each of said timers configured to control a signal that removes power to said associated cache line after a decay interval.

2. The cache memory of claim 1, wherein a timer associated with a given cache line is reset each time said associated cache line is accessed.

3. The cache memory of claim 1, wherein said decay interval is variable.

4. The cache memory of claim 3, wherein said variable decay interval can be increased to increase performance.

5. The cache memory of claim 3, wherein said variable decay interval can be lowered to save power.

6. The cache memory of claim 3, wherein said variable decay interval is implemented by adjusting a reference value in a comparator.

7. The cache memory of claim 3, wherein said variable decay interval is implemented by adjusting a bias of a comparator.

8. The cache memory of claim 1, wherein said timer is a k bit timer and said timer receives a tick from a global N-bit counter where k is less than N.

9. The cache memory of claim 1, wherein said timer is a k bit timer and said timer receives a tick from any source.

10. The cache memory of claim 1, wherein said timer is any k-state finite state machine (FSM) that can function logically as a counter.

11. The cache memory of claim 1, further comprising a dirty bit associated with each of said cache lines to indicate when a contents of said cache line must be written back to main memory before said power is removed from said associated cache line after said decay interval.

12. The cache memory of claim 11, wherein one or more of said timers associated with said plurality of cache lines are cascaded to distribute said writing back to main memory over time.

13. The cache memory of claim 1, wherein said removing power from said associated cache line resets a valid field associated with said cache line.

14. The cache memory of claim 1, wherein said signal is further configured to remove a potential from said cache line.

15. The cache memory of claim 1, wherein a first access to a cache line that has been powered down results in a cache miss, resets said corresponding timer and restores power to said cache line.

16. The cache memory of claim 1, wherein a first access to a cache line that has been powered down is delayed by a period of time that permits said cache line to stabilize after power is restored.

17. The cache memory of claim 1, wherein said timer is an analog device that detects a predefined voltage on said device corresponding to said decay interval.

18. The cache memory of claim 1, wherein said cache memory is a multilevel cache memory, and further comprising one or more inclusion bits associated with each of said cache lines, said inclusion bits indicating whether data stored in said cache line exists in upper levels and wherein said power is removed only from a data field associated with said cache line after said decay interval when said inclusion bits indicate the existence of the same data in an upper level.

19. The cache memory of claim 1, wherein said cache memory is a multilevel cache memory, and wherein said power is removed from a cache line after said decay interval only if said power is removed in corresponding upper levels of said multilevel cache memory.

20. A method for reducing leakage power in a cache memory, said cache memory having a plurality of cache lines, said method comprising the steps of:
   providing a timer for each of said cache lines;
   resetting said timer each time said cache line is accessed; and
   removing power from said associated cache line after a decay interval.

21. The method of claim 20, wherein said decay interval is variable.

22. The method of claim 20, wherein said timer is a k-bit timer and said timer receives a tick from a global N-bit counter where k is less than N.

23. The method of claim 20, further comprising the step of evaluating a dirty bit associated with each of said cache lines that indicates when a contents of said cache line must be written back to main memory before said power is removed from said associated cache line after said decay interval.

24. The method of claim 20, wherein said step of removing power from said associated cache line further comprises the step of resetting a valid field associated with said cache line.

25. The method of claim 20, wherein a first access to a cache line that has been powered down further comprises the steps of establishing a cache miss, resetting said corresponding timer and restoring power to said cache line.

26. The method of claim 20, wherein a first access to a cache line that has been powered down further comprises the step of delaying said access by an appropriate amount of time until said cache line stabilizes after power is restored.

27. A cache memory, comprising:
   a plurality of cache lines for storing a value from main memory, each of said cache lines comprised of one or more dynamic random access memory (DRAM) cells, each of said DRAM cells being refreshed each time said cache line is accessed, each of said DRAM cells reliably storing said value for a safe period; and
   a timer associated with each of said plurality of cache lines, each of said timers controlling a signal that resets a valid bit associated with said cache line after said safe period.

28. The cache memory of claim 27, wherein said safe period is established based on characteristics of an integrated circuit (IC) process used to manufacture said DRAM cells.

29. The cache memory of claim 27, wherein said DRAM cells are embodied as 4-T DRAM cells.

30. The cache memory of claim 27, wherein said timer is a k bit timer and said timer receives a tick from a global N-bit counter where k is less than N.

31. The cache memory of claim 27, wherein said timer is a k bit timer and said timer receives a tick from any source.

32. The cache memory of claim 27, wherein said timer is any k-state finite state machine (FSM) that can function logically as a counter.

33. The cache memory of claim 27, further comprising a dirty bit associated with each of said cache lines to indicate when a contents of said cache line must be written back to main memory before said power is removed from said associated cache line after said decay interval.

34. A method for reducing leakage power in a cache memory, said cache memory having a plurality of cache lines, for storing a value from main memory, each of said cache lines comprised of one or more dynamic random access memory (DRAM) cells, each of said DRAM cells reliably storing said value for a safe period, said method comprising the steps of:
   refreshing each of said DRAM cells each time said corresponding cache line is accessed,; and
   providing a timer for each of said cache lines;
   resetting said timer each time said cache line is accessed; and
   resetting a valid bit associated with said cache line after said safe period.

35. The method of claim 34, wherein said safe period is established based on characteristics of an integrated circuit (IC) process used to manufacture said DRAM cells.

* * * * *